US009620603B2

(12) United States Patent
Ku et al.

(10) Patent No.: US 9,620,603 B2
(45) Date of Patent: Apr. 11, 2017

(54) SEMICONDUCTOR DEVICE WITH A P-N JUNCTION FOR REDUCED CHARGE LEAKAGE AND METHOD OF MANUFACTURING THE SAME

(71) Applicant: MACRONIX INTERNATIONAL CO., LTD., Hsin-chu (TW)

(72) Inventors: Shaw-Hung Ku, Taipei (TW); Chih-Hsiung Lee, Puzih (TW)

(73) Assignee: Macronix International Co., Ltd., Hsin-chu (TW)

( * ) Notice: Subject to any disclaimer, the term of this patent is extended or adjusted under 35 U.S.C. 154(b) by 0 days.

(21) Appl. No.: 14/694,325

(22) Filed: Apr. 23, 2015

(65) Prior Publication Data

US 2016/0315161 A1    Oct. 27, 2016

(51) Int. Cl.
*H01L 29/76* (2006.01)
*H01L 29/423* (2006.01)
*H01L 21/28* (2006.01)
*H01L 29/49* (2006.01)

(52) U.S. Cl.
CPC .. *H01L 29/42328* (2013.01); *H01L 21/28273* (2013.01); *H01L 29/4916* (2013.01)

(58) Field of Classification Search
CPC ......... H01L 27/10802; H01L 27/11517; H01L 27/1156; H01L 27/11563
USPC ........................................ 257/314, 315, 321
See application file for complete search history.

(56) References Cited

U.S. PATENT DOCUMENTS

| | | | | |
|---|---|---|---|---|
| 6,337,246 B1* | 1/2002 | Sobek | ............... | H01L 21/28273 257/E21.209 |
| 6,630,383 B1* | 10/2003 | Ibok | .................. | H01L 21/28194 257/321 |
| 8,633,546 B2* | 1/2014 | Park | .................. | H01L 21/82384 257/368 |
| 2007/0262395 A1* | 11/2007 | Gibbons | ........... | H01L 21/82342 257/392 |
| 2009/0017573 A1* | 1/2009 | Mouli | ................. | H01L 27/1463 438/59 |
| 2012/0007152 A1 | 1/2012 | Chen | | |
| 2012/0244695 A1* | 9/2012 | Zeng | ................. | H01L 21/28273 438/593 |
| 2013/0256620 A1 | 10/2013 | Huang et al. | | |

OTHER PUBLICATIONS

Blomme, Pieter, et al.; "Novel Dual Layer Floating Gate Structure as Enabler of Fully Planar Flash Memory"; *2010 Symposium on VLSI Technology Digest of Technical Papers*; 2010; pp. 129-130.
Ohba, Ryuji, et al.; "Nonvolatile Si Quantum Memory with Self-Aligned Doubly-Stacked Dots"; *IEEE Transactions on Electron Devices*; vol. 49, No. 8; Aug. 2002; pp. 1392-1398.

(Continued)

*Primary Examiner* — Tan N Tran
(74) *Attorney, Agent, or Firm* — Alston & Bird LLP

(57) ABSTRACT

Provided are improved semiconductor memory devices and methods for manufacturing such semiconductor memory devices. A method may incorporate the formation of a p-n junction in a conductive layer. The method may allow for the production of semiconductor memory devices of reduced size.

16 Claims, 11 Drawing Sheets

(56) References Cited

OTHER PUBLICATIONS

Afshari, Kamran; "Nonvolatile Memory with Multi-Stack Nanocrystals as Floating Gates"; *National Nanotechnology Infrastructure Network*; 2007 REU Research Accomplishments; pp. 38-39.

Kim, G. et al., *Novel MOSFET Structure Using p-n Junction Gate for Ultra-low Subthreshold-Swing*, ISDRS 2011 (Dec. 2011) 2 pages.

* cited by examiner

SEMICONDUCTOR DEVICE WITH A P-N JUNCTION FOR REDUCED CHARGE LEAKAGE AND METHOD OF MANUFACTURING THE SAME

FIELD

Embodiments of the present invention generally relate to a semiconductor device, in particular, a memory cell, and methods of manufacturing the semiconductor device.

BACKGROUND

Memory devices generally comprise a plurality of gate structures. These gate structures may include a control gate and a floating gate that is positioned between the control gate and a substrate. The floating gate is a conductive layer normally fabricated of a polysilicon material. The floating gate is not attached to any electrodes or power sources and is itself generally surrounded by an insulation material.

The operation of the memory cells is dependent upon the charge stored in the floating gate at the threshold voltage needed to represent information stored in these devices. Performance of the memory cells typically includes a performance specification or rating of the programming speed that influences the speed of erase and write operations. The speed is typically limited by the rate at which electrons can be pumped into (writing) and out of (erasing) the device without causing damage to the device. Typically, erasing and writing operations must be capable of operating within 1 msec at a specified applied voltage.

The semiconductor industry is increasingly driven towards smaller and more capable electronic devices, such as smaller memory devices. To reduce the size of such devices, while maintaining or improving their respective capabilities, the size of components and the distance between such components may be reduced.

Applicant has identified deficiencies and problems associated with conventional processes for manufacturing memory devices and the resulting memory devices. For instance, with regards to flash memory devices, as the cell size is reduced, issues arise that prevent further reduction in size while maintaining the cell's capabilities and respective function. As the individual layers of the gate structures are made smaller and moved closer to each other, charge leakage from the floating gate may increase, thereby reducing performance of the device.

Through applied effort, ingenuity, and innovation, certain of these identified problems have been solved by developing solutions that are included in various embodiments of the present invention, which are described in detail below.

SUMMARY

Embodiments of the present invention therefore provide methods of manufacturing semiconductor devices useful in the manufacture of memory devices, especially those reduced in size, and provide semiconductor memory devices resulting from such methods.

The present invention provides a semiconductor device with reduced charge leakage such that the gate structures may be made smaller and closer together without sacrificing performance of the semiconductor device. Without intending to be bound by theory, by forming a p-n junction in the first conductive layer, such as a floating gate, the charge leakage across the second dielectric layer, such as an inter-poly dielectric layer, may be reduced. By reducing the charge leakage across the second dielectric layer, the second dielectric layer may be reduced in thickness and/or completely removed from wrapping the first conductive layer. The gate structures can thereby be made closer together and allow for a smaller semiconductor device without sacrificing performance of the device.

In certain embodiments of the invention, a gate structure is provided comprising a substrate; a first dielectric layer disposed along the substrate; a first conductive layer disposed along the dielectric layer; and a second dielectric layer disposed along the first conductive layer, wherein the first conductive layer comprises p-type dopants and n-type dopants. The p-type dopants and n-type dopants may form a p-n junction in the first conductive layer.

In some embodiments of the present invention, the p-type dopants may form a p-type dopant area and the n-type dopants may form an n-type dopant area in the first conductive layer. The p-type dopant area may be layered over the n-type dopant area in the first conductive layer. In some embodiments, the p-type dopant area may be in physical contact with the n-type dopant area.

In one embodiment of the present invention, the second dielectric layer may be disposed along a sidewall of the first conductive layer while in other embodiments, a third dielectric layer may be disposed along a sidewall of the first conductive layer.

Certain embodiments of the present invention provide a gate structure comprising an n-type dopant area and a p-type dopant area where a ratio of a thickness of the p-type dopant area to a thickness of the n-type dopant area may be from 1:3 to 3:1.

In certain embodiments, the second dielectric layer may comprise an oxide-nitride-oxide layer. In some embodiments, the first conductive layer may comprise polysilicon. Still further, in other embodiments, the gate structure may further comprise a second conductive layer disposed along the second dielectric layer. In some embodiments, the second conductive layer may comprise polysilicon.

An aspect of the invention also provides a method for manufacturing a gate structure comprising providing a substrate, forming a first dielectric layer over the substrate, forming a first conductive layer over the first dielectric layer, forming an n-type dopant area in the first conductive layer, forming a p-type dopant area in the first conductive layer, and forming a second dielectric layer over the first conductive layer.

In certain embodiments, the method for manufacturing a gate structure may comprise forming an n-type dopant area in the first conductive area, wherein the step of forming an n-type dopant area in the first conductive area may be performed prior to the step of forming a p-type dopant area in the first conductive layer. In some embodiments of the invention, the n-type dopant area may be formed by ion implantation, in-situ generation, or combinations thereof. In certain embodiments, the p-type dopant area may be formed by ion implantation, in-situ generation, or combinations thereof. In some embodiments of the present invention, the p-type dopant area and the n-type dopant area may be formed such that a ratio of a thickness of the p-type dopant area to a thickness of the n-type dopant area is from 1:3 to 3:1. In certain embodiments, the n-type dopant area and the p-type dopant area may be in physical contact in the first conductive layer.

In some embodiments of the invention, the step of forming the second dielectric layer may comprise forming a planar second dielectric layer along the gate structure. In certain embodiments, the second dielectric layer may comprise an oxide-nitride-oxide layer. In yet other embodiments, the first conductive layer may comprise polysilicon.

In some embodiments of the present invention, the method for manufacturing a gate structure may further comprise forming a second conductive layer over the second dielectric layer. In some embodiments, the step of forming a second conductive layer comprises forming a polysilicon layer over the second dielectric layer.

The above summary is provided merely for purposes of summarizing some example embodiments of the invention so as to provide a basic understanding of some aspects of the invention. Accordingly, it will be appreciated that the above described example embodiments are merely examples and should not be construed to narrow the scope or spirit of the invention in any way. It will be appreciated that the scope of the invention encompasses many potential embodiments, some of which will be further described below, in addition to those here summarized.

BRIEF DESCRIPTION OF THE DRAWING(S)

Having thus described the invention in general terms, reference will now be made to the accompanying drawings, which are not necessarily drawn to scale, and wherein:

FIG. 1 provides comparable cross-sectional views of a conventional semiconductor device and a semiconductor device in accordance with embodiments of the present invention;

FIG. 2 provides comparable cross-sectional views of a conventional semiconductor device and a semiconductor device in accordance with embodiments of the present invention;

FIG. 3 illustrates the dopant concentration in an n-type dopant area and in a p-type dopant area of a semiconductor device in accordance with embodiments of the present invention;

FIG. 4(a) provides a comparison of the program operation of conventional semiconductor devices and the program operation of semiconductor devices prepared according to embodiments of the present invention;

FIG. 4(b) provides a comparison of the erase operation of conventional semiconductor devices and the erase operation of semiconductor devices prepared according to embodiments of the present invention;

DETAILED DESCRIPTION

Figure 1:
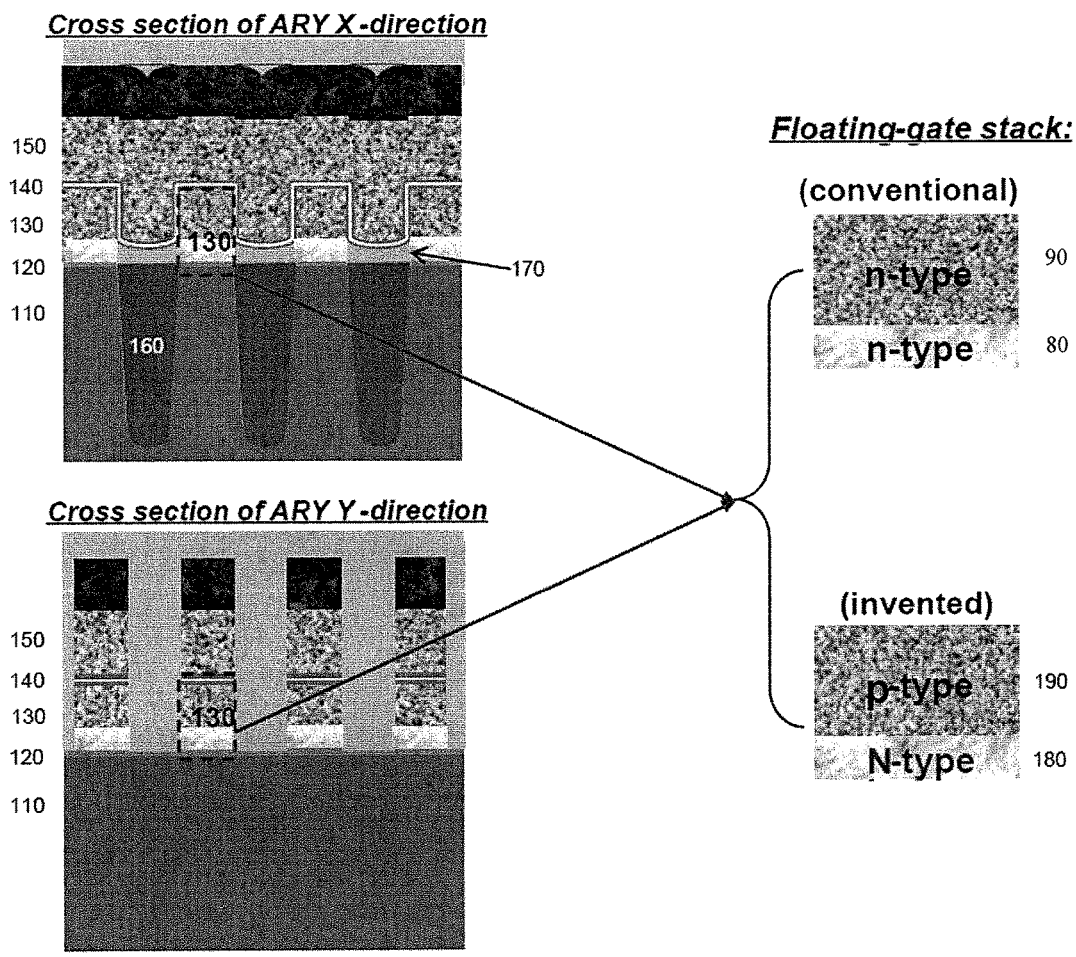

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a gate structure" includes a plurality of such gate structures.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

In the semiconductor industry, there is an increased desire to reduce the size of memory cells and, accordingly, reduce the size of the gate structures and spacing between the gate structures. In conventional memory cells, an interpoly dielectric layer and control gate may be wrapped around a floating gate to isolate the floating gate and obtain a sufficient gate coupling ratio. As used herein, "gate coupling ratio" refers to a measurement of the performance of a memory device and may be defined according the equation (1) below:

$$GCR = \frac{C_{ONO}}{C_{ONO} + C_{TOX}} \quad (1)$$

where:

GCR=gate coupling ratio $C_{ONO}$=capacitance of oxide/nitride/oxide (ONO) dielectric layer $C_{TOX}$=capacitance of tunnel oxide layer.

For theoretically perfect coupling, the gate coupling ratio is equal to 100%, which means that the capacitance of the tunnel oxide layer would be driven to zero. A suitable gate coupling ratio may be about 50% (0.5) or larger. Generally, increasing the gate coupling ratio lowers the operating voltage of the memory device and increases the speed of the memory device.

As the size of gate structures and the half-pitch is reduced, the space between adjacent gates becomes too small for the interpoly dielectric layer and the control gate to wrap the floating gate. The interpoly dielectric layer may be reduced in thickness, however, as the interpoly dielectric layer is reduced, increased charge leakage across the interpoly dielectric layer occurs and the gate coupling ratio decreases. For instance, below certain half-pitches, such as 30 nm, the space between adjacent gates is too small for both the interpoly dielectric layer and the control gate to wrap the floating gate and still maintain a suitable gate coupling ratio.

Prior art processes of preparing memory cells have attempted to solve this problem with the use of high dielectric interpoly dielectric layers in place of oxide-nitride-oxide-based interpoly dielectric layers or the use of metal conductive layers in place of conventional polysilicon-based control gates. However, these materials are unfamiliar and not preferable. Other processes have attempted to use dual-layer quantum dot or hybrid-floating gate structures (e.g., n-type dopant polysilicon and metal layers). However, the formation of quantum dots is complex and uncontrollable, and the choice of metal for the hybrid-floating gate is limiting.

There remains a need in the art for alternative memory device structures that resolve the problem of interpoly dielectric current leakage especially as the size of such devices is further reduced.

The present inventors have found that by forming a p-n junction in a conductive layer, such as in a floating gate, the charge leakage across the interpoly dielectric layer may be reduced and allow for a reduced thickness of the interpoly dielectric layer without increasing the charge leakage. As used herein, a "p-n junction" refers to the transition between an area comprising p-type dopants and an area comprising n-type dopants. The formation of a p-n junction in a conductive layer creates a potential barrier in the conductive layer that may reduce charge leakage across the interpoly dielectric layer. By reducing charge leakage, the program saturation may be prolonged and the program window may be increased. In certain embodiments, the p-n junction in the conductive layer allows the interpoly dielectric layer along the sidewalls of the conductive layer to be reduced and in some embodiments, completely removed from the sidewalls of the conductive layer while maintaining a suitable gate coupling ratio. In some embodiments, the present invention provides an improved device without using unfamiliar or complex materials or adding complicated process steps to the formation of the memory cell. In certain embodiments, the present invention provides a simple process for forming a memory cell capable of being reduced in size while maintaining a suitable gate coupling ratio and while using conventional interpoly dielectric layers and control gates.

As used herein, "n-type dopant area" refers to an area in the respective layer of the semiconductor device that has been doped with an n-type dopant such as phosphorus. "P-type dopant area" refers to an area in the respective layer of the semiconductor device that has been doped with a p-type dopant such as boron.

As used herein, "gate structure" refers to a component of a semiconductor device, more particularly a memory device. Non-volatile memory refers to a semiconductor device which is able to store information even when the supply of electricity is removed from the memory. Non-volatile memory includes, without limitation, Mask Read-Only Memory, Programmable Read-Only Memory, Erasable Programmable Read-Only Memory, Electrically Erasable Programmable Read-Only Memory, and Flash Memory, such as NAND and NOR devices.

FIG. 1 illustrates cross-sectional views of a semiconductor device in accordance with embodiments of the present invention. FIG. 1 provides a cross section of a semiconductor device along the x-direction and along the y-direction. As shown in FIG. 1, the semiconductor device may comprise a substrate 110, a first dielectric layer 120 disposed along the substrate, and a first conductive layer 130 disposed along the first dielectric layer. In this embodiment, the semiconductor device further comprises a second dielectric layer 140 disposed along the first conductive layer 130 and a second conductive layer 150 disposed along the second dielectric layer 140. The embodiment of FIG. 1 also includes a shallow trench isolation ("STI") structure 160. Generally, an STI is defined by sidewalls and a bottom and comprises dielectric material such as silicon oxide ($SiO_2$), silicon nitride ($Si_3N_4$), silicon oxynitride ($SiO_xN_y$), or any combination thereof. The embodiment of FIG. 1 additionally includes a third dielectric layer 170 disposed over the STI.

The substrate may include any underlying material or materials upon which a device, a circuit, an epitaxial layer, or a semiconductor may be formed. Generally, a substrate may be used to define the layer or layers that underlie a semiconductor device or even forms the base layer of a semiconductor device. Without intending to be limiting, the substrate may include one or any combination of silicon, doped silicon, germanium, silicon germanium, semiconductor compounds, or other semiconductor materials.

To form semiconductor devices such as the semiconductor device illustrated in FIG. 1, a first dielectric layer may be formed on a substrate. The first dielectric layer may comprise any suitable dielectric material, such as silicon oxide ($SiO_2$), silicon nitride ($Si_3N_4$), silicon oxynitride ($SiO_xN_y$), or any combination thereof. In certain embodiments, the first dielectric layer may comprise an oxide-nitride-oxide (ONO) layer. The first dielectric layer may be formed by any suitable deposition process, such as chemical vapor deposition (CVD) or spin-on dielectric processing. In certain embodiments, the first dielectric layer may be grown on the substrate. In some embodiments, the first dielectric layer may be referred to as a tunnel oxide layer.

In some embodiments, a first conductive layer may be formed over the first dielectric layer. In the embodiment of FIG. 1, a first conductive layer 130 is formed over the first dielectric layer 120. In some embodiments, the first conductive layer may comprise polysilicon. The first conductive layer may be formed by any suitable process, such as CVD or spin coating.

The formation of the individual layers that shape the gate structure may be performed by any suitable method and in any suitable order. For instance, in some embodiments, an STI structure may be formed after etching the first conductive layer to form the gate structure. In certain embodiments, the third dielectric layer may be formed over the STI structure and may comprise any suitable dielectric material, such as silicon oxide ($SiO_2$), silicon nitride ($Si_3N_4$), silicon oxynitride ($SiO_xN_y$), or any combination thereof.

In certain embodiments, a second dielectric layer may be formed over the first conductive layer. In the embodiment of FIG. 1, a second dielectric layer 140 is formed over the first conductive layer 130. The second dielectric layer may comprise any suitable dielectric material, such as silicon oxide ($SiO_2$), silicon nitride ($Si_3N_4$), silicon oxynitride ($SiO_xN_y$), or any combination thereof. In certain embodiments, the second dielectric layer may comprise an oxide-nitride-oxide (ONO) layer. The second dielectric layer may be formed by any suitable deposition process, such as chemical vapor deposition (CVD) or spin-on dielectric processing. In certain embodiments, the second dielectric layer may be grown on the device. The second dielectric layer may be referred to as an interpoly dielectric layer when positioned between two polysilicon layers.

In some embodiments, a second conductive layer may be formed over the second dielectric layer. In the embodiment of FIG. 1, a second conductive layer 150 is formed over the interpoly dielectric layer 140. In some embodiments, the second conductive layer may comprise polysilicon. The second conductive layer may be formed by any suitable process, such as CVD or spin coating.

In the embodiment illustrated in FIG. 1, the first conductive layer may be referred to as a floating gate while the second conductive layer may be referred to as the control gate. The floating gate may be configured to hold a charge at a threshold voltage. A plurality of these representations in a memory device is used to identify information, typically information that is needed by a processing system.

As shown in FIG. 1, conventional conductive layers may comprise only n-type dopant areas 80, 90, or only p-type dopants. In some embodiments of the present invention, the first conductive layer may comprise n-type dopants and p-type dopants. In the embodiment of the invention illustrated in FIG. 1, the n-type dopants form an n-type dopant area 180 adjacent to a p-type dopant area 190 formed by the p-type dopants. In some embodiments, a p-type dopant area is layered above an n-type dopant area. In certain embodiments, it may be preferable to locate the n-type dopant area under the p-type dopant area such that current flows through the n-type dopant area prior to reaching the p-type dopant area. For instance, in some embodiments, the n-type dopant area may have a lower potential than the p-type dopant area such that positioning the n-type dopant area under the p-type dopant area creates a higher potential barrier at the junction between the n-type dopant area and the p-type dopant area. Without intending to be bound by theory, the position of the n-type dopant area near the p-type dopant area, which has a higher potential than the n-type dopant area may create a potential barrier such that current flowing through the conductive layer may be prevented from leaking across the second dielectric layer. In some embodiments, an n-type dopant area may be physically contacting a p-type dopant area. In certain embodiments, the conductive layer may comprise one or more n-type dopant areas, such as a plurality of n-type dopant areas, and may comprise one or more p-type dopant areas, such as a plurality of p-type dopant areas, wherein one or more n-type dopant areas is adjacent to a p-type dopant area such that a p-n junction is formed.

The one or more n-type dopant areas and the one or more p-type dopant areas may have any suitable thickness so long as at least one n-type dopant area and one p-type dopant area create a potential barrier within the conductive layer. In certain embodiments, the ratio of the thickness of the n-type dopant area to the thickness of the p-type dopant area may range from about 1:5 to 5:1, such as about 1:4 to 4:1, 1:3 to 3:1, or 1:2 to 2:1. In certain embodiments, it may be preferable to have the ratio of the thickness of the n-type dopant area to the thickness of the p-type dopant area range from about 1:3 to 3:1. For instance, an n-type dopant area may be about 300 Å thick while the p-type dopant area is about 900 Å thick. In other embodiments, an n-type dopant area may be about 900 Å thick while a p-type dopant area is about 300 Å thick. In some embodiments, the thickness of the n-type dopant area is greater than about 200 Å. In certain embodiments, when the n-type thickness is outside of this range, the n-type dopants may be easily depleted.

The total thickness of the n-type dopant area and the p-type dopant area may be any suitable thickness to allow for the creation of the potential barrier in the conductive layer. For instance, in certain embodiments, the total thickness of an adjacent n-type dopant area and p-type dopant area may be from about 600 Å to 1500 Å, such as from about 700 Å to 1400 Å, or from about 900 Å to 1200 Å. In certain embodiments, the total thickness of one or more n-type dopant areas and one or more p-type dopant areas may be about 1200 Å thick in the first conductive layer.

Figure 3:
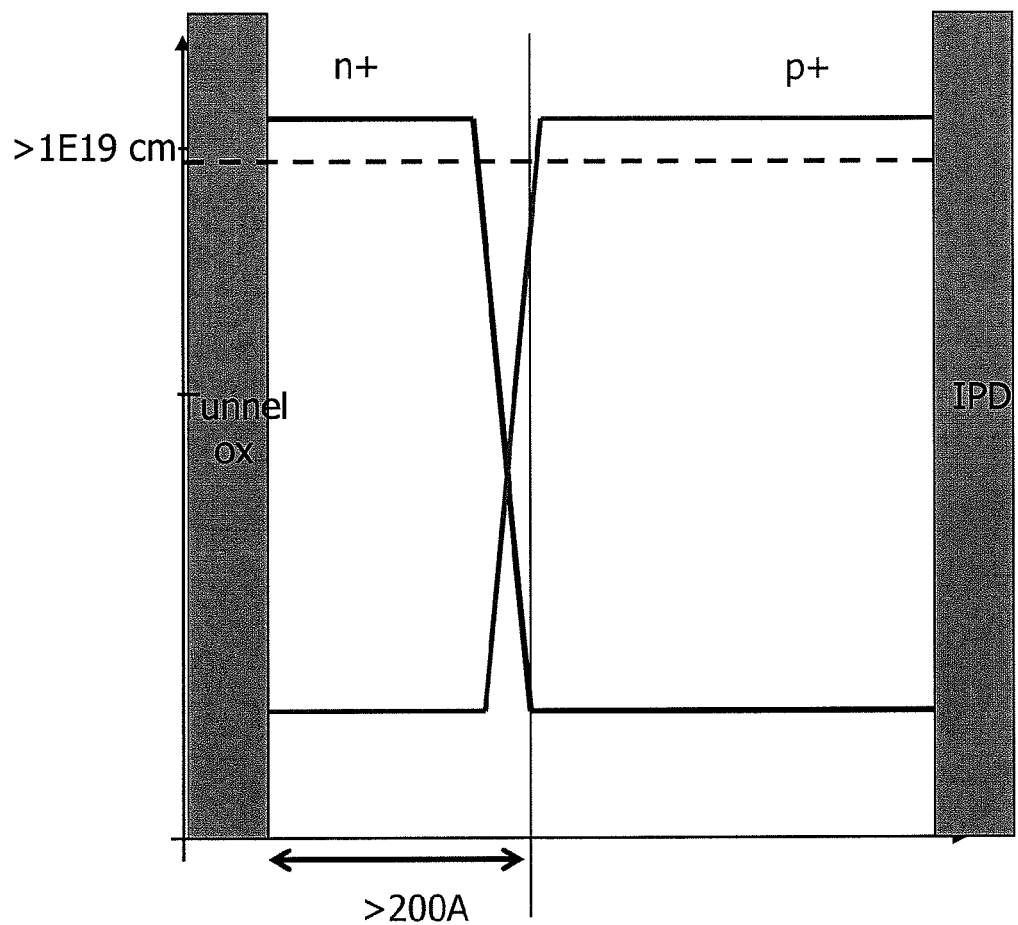

The concentration of dopants in the n-type dopant area and the concentration of the p-type dopant area may be any suitable concentration such that a barrier is formed between at least one n-type dopant area and one p-type dopant area in the conductive layer. For instance, in certain embodiments, the concentration may be greater than about $1 \times 10^{19}$ $cm^{-3}$. In some embodiments, depending on the location along the vertical axis, the concentration of dopants may be greater than $1 \times 10^{19}$ $cm^{-3}$. For instance, in some embodiments, the concentration of n-type dopants may be greater than $1 \times 10^{19}$ $cm^{-3}$ and may decrease closer to the p-type dopant area. In some embodiments, the concentration of p-type dopants may be greater than $1 \times 10^{19}$ $cm^{-3}$ and may decrease closer to the n-type dopant area. One embodiment of the present invention is illustrated in FIG. 3. FIG. 3 illustrates the dopant concentration in the n-type dopant area and in the p-type dopant area. In this embodiment, the n-type dopant area and the p-type dopant area are located in a floating gate layer situated between a tunnel oxide ("Tunnel ox") layer and an interpoly dielectric ("IPD") layer. As also noted in FIG. 3, in some embodiments of the invention, the thickness of the n-type dopant area or the p-type dopant area may be greater than 200 Å.

The n-type dopant area and the p-type dopant area can be prepared by any suitable method of doping a conductive layer. For instance, the n-type dopant area and/or p-type dopant area can be prepared by ion implantation, in-situ generation, or combinations thereof. Any other suitable process to form the n-type dopant area and p-type dopant area may be used such that at least one n-type dopant area and one p-type dopant area form a p-n junction in the respective conductive layer. In certain embodiments, by doping the conductive layer with an n-type dopant followed by doping the conductive layer with a p-type dopant, a natural p-n junction may be formed in the conductive layer. In certain other embodiments, by doping the conductive layer with p-type dopant followed by doping the conductive layer with an n-type dopant, a natural p-n junction may be formed in the conductive layer. The dopant concentration may be checked using SIMS along the vertical axis.

The embodiment illustrated in FIG. 1 comprises a second dielectric layer 140 disposed over the first conductive layer 130. In some embodiments, the second dielectric layer may wrap around the first conductive layer. As used herein, the term "wrap" refers to the position of a first layer respective to an adjacent layer where the first layer covers more than one surface of the adjacent layer. The surface may be the top surface of the layer, the sidewalls of the layer, or the bottom of the layer. For instance, in the embodiment illustrated in FIG. 1, the second dielectric layer 140 wraps around the first conductive layer 130. The wrapping of the second dielectric layer 140 around the first conductive layer 130 can be seen in the x-direction cross section of the semiconductor device in FIG. 1. In this embodiment, the second dielectric layer 140 covers more than one surface of the first conductive layer 130. In this embodiment, the second dielectric layer 140 is disposed along the top surface and two sidewalls of the first conductive layer 130. Without intending to be bound by theory, the second dielectric layer wraps around the first conductive layer to isolate the first conductive layer.

In certain embodiments, the second dielectric layer may be reduced in thickness as compared to conventional semiconductor devices. In prior art semiconductor devices, when the second dielectric layer is reduced in thickness, charge leakage across the second dielectric layer may result. However, the inventors have found that by incorporating both an n-type dopant area and a p-type dopant area in the first conductive layer to form a p-n junction, the second dielectric layer may be reduced in thickness without experiencing an increase in charge leakage across the second dielectric layer. When the second dielectric layer is reduced in thickness in accordance with embodiments of the present invention, the half-pitch may be reduced and a smaller memory device in general may be possible without sacrificing the performance of the semiconductor. The incorporation of both an n-type and p-type dopant area in the conductive layer may provide an intrinsic potential barrier that may allow the second dielectric layer to be reduced in thickness without increasing charge leakage and hindering the gate coupling ratio. In certain embodiments, the thickness of the second dielectric layer along the sidewalls of the conductive layer may be reduced to about 100 to 125 Å, such as about 105, 110, 115, or 120 Å. The typical thickness of the second dielectric layer along the sidewalls of the conductive layer may be about 150 to 200 Å. Thus, in some embodiments, the thickness can be reduced by more than 30%. In some embodiments, the formation of the p-n junction may allow for a 30 to 40% reduction in the thickness of the second dielectric layer along the sidewalls of the conductive layer as compared to conventional semiconductor devices, such as conventional memory devices where the floating gate is wrapped with an interpoly dielectric layer and the control gate.

In certain other embodiments, the incorporation of both an n-type dopant area and a p-type dopant area in the conductive layer may allow the second dielectric layer to become planar. As used herein, the term "planar" refers to embodiments where the second dielectric layer does not need to wrap the first conductive layer. In other words, the second dielectric layer is positioned along the horizontal plane over the first conductive layer and does not line the sidewalls of the first conductive layer. In certain embodiments, a planar second dielectric layer may be desirable as removal of the second dielectric layer from the sidewalls of the conductive layer may allow the half-pitch of the device to be significantly reduced and may allow for a much smaller memory device in general. In certain embodiments, the incorporation of both an n-type and p-type dopant area in the conductive layer may provide an intrinsic potential barrier that may allow the second dielectric layer to be completely removed from the sidewalls of the first conductive layer while still maintaining a suitable gate coupling ratio.

In certain embodiments, by modifying the properties of each of the n-type dopant area and the p-type dopant area, the potential barrier formed in the first conductive layer may be modified and may allow the second dielectric layer to be reduced in thickness or even completely removed from the sidewalls of the first conductive layer while maintaining a suitable gate coupling ratio. For instance, in some embodiments, the concentration of the dopants in each respective area, the thickness of each dopant area, and/or position of each dopant area may be modified to allow the second dielectric layer to be reduced in thickness. In other embodiments, the concentration of the dopants in each respective area, the thickness of each dopant area, and/or position of each dopant area may be modified to allow for a planar second dielectric layer. For example, the concentration of the n-type dopants and/or the concentration of the p-type dopants may be modified to increase the potential barrier and further reduce the charge leakage across the second dielectric layer allowing for a planar second dielectric layer.

Figure 2:
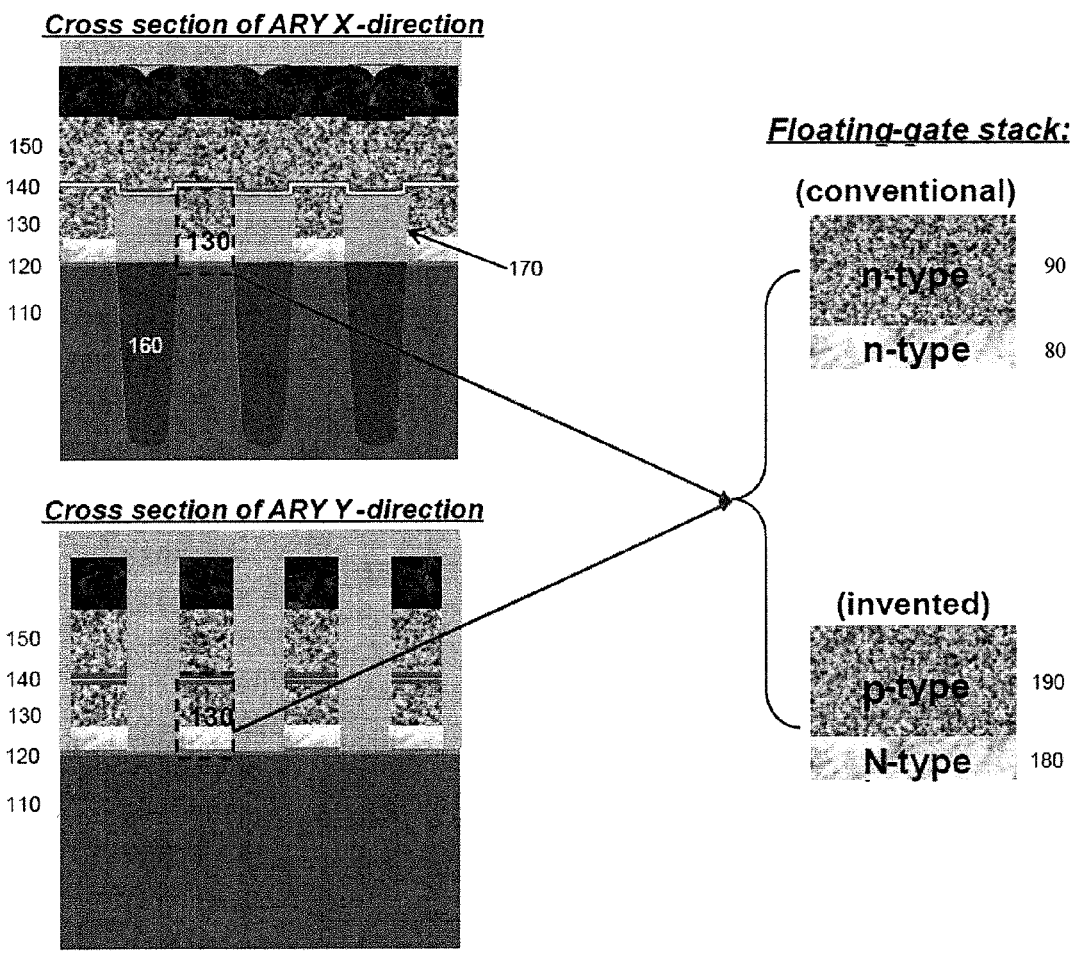

FIG. 2 illustrates cross-sectional views of a semiconductor device in accordance with embodiments of the present invention. FIG. 2 provides a cross section of a semiconductor device along the x-direction and along the y-direction. As shown in FIG. 2, the second dielectric layer does not wrap the first conductive layer. In this embodiment, the second dielectric layer is substantially planar over the first conductive layer 130 and does not line the sidewalls of the first conductive layer 130. The semiconductor device of FIG. 2 includes a substrate 110, a first dielectric layer 120 deposited over the substrate, and a first conductive layer over the first dielectric layer 120. The semiconductor device of FIG. 2 also includes a second dielectric layer 140 and a second conductive layer 150 deposited over the second dielectric layer 140. The substrate, first dielectric layer, first conductive layer, second dielectric layer, and second conductive layer may comprise similar materials as discussed previously. For instance, the substrate may comprise any underlying material or materials upon which a device, a circuit, an epitaxial layer, or a semiconductor may be formed such as one or any combination of silicon, doped silicon, germanium, silicon germanium, semiconductor compounds, or other semiconductor materials. The first and second dielectric layer may comprise any suitable dielectric material, such as silicon oxide ($SiO_2$), silicon nitride ($Si_3N_4$), silicon oxynitride ($SiO_xN_y$), or any combination thereof. In certain embodiments, the first and/or second dielectric layer may comprise an oxide-nitride-oxide (ONO) layer. The first and second conductive layer may comprise any suitable conductive material such as polysilicon. The substrate, first dielectric layer, first conductive layer, second dielectric layer, and second conductive layer may be formed by any suitable means such as those processes discussed previously in regards to each of the respective components.

In the embodiment of FIG. 2, the first conductive layer 130 comprises an n-type dopant area 180 and a p-type dopant area 190. The incorporation of both an n-type dopant area and a p-type dopant area provides a potential barrier in the first conductive layer that allows the second dielectric layer to be completely removed from the sidewalls of the first conductive layer 130. As shown in FIG. 2, the second dielectric layer 140 is substantially planar along the gate structure. The semiconductor device of FIG. 2 includes a third dielectric layer 170 that is located along the sidewalls of the first conductive layer 130. The third dielectric layer may comprise any suitable dielectric material, such as silicon oxide ($SiO_2$), silicon nitride ($Si_3N_4$), silicon oxynitride ($SiO_xN_y$), or any combination thereof. The third dielectric layer 170 may fill the area between adjacent conductive layers such that the second dielectric layer 140 positioned over the first conductive layer 130 is substantially planar along adjacent gate structures. By removing the second dielectric layer from the sidewalls of the first conductive layer, the half-pitch of the device may be reduced and the semiconductor may be made smaller while maintaining a suitable gate coupling ratio.

As shown in FIG. 2, conventional conductive layers may comprise only n-type dopant areas or may comprise only p-type dopant areas. In some embodiments of the present invention, the first conductive layer may comprise an n-type dopant area and a p-type dopant area such that a p-n junction is formed in the first conductive layer. In the embodiment illustrated in FIG. 2, the n-type dopant area is located adjacent to the p-type dopant area, such as under the p-type dopant area. In certain embodiments, it may be preferable to locate the n-type dopant area under the p-type dopant area such that current flows through the n-type dopant area prior to reaching the p-type dopant area. For instance, as discussed previously, in some embodiments, the n-type dopant area may have a lower potential than the p-type dopant area such that positioning the n-type dopant area under the p-type dopant area creates a higher potential barrier at the junction between the n-type dopant area and the p-type dopant area. Without intending to be bound by theory, the position of the n-type dopant area next to the p-type dopant area, which has a higher potential than the n-type dopant area, creates a potential barrier such that current flowing through the conductive layer is prevented from leaking across the second dielectric layer. As shown in the embodiment of FIG. 2, an n-type dopant area is physically contacting a p-type dopant area. In certain embodiments, the conductive layer may comprise one or more n-type dopant areas and may comprise one or more p-type dopant areas.

Figure 4A:
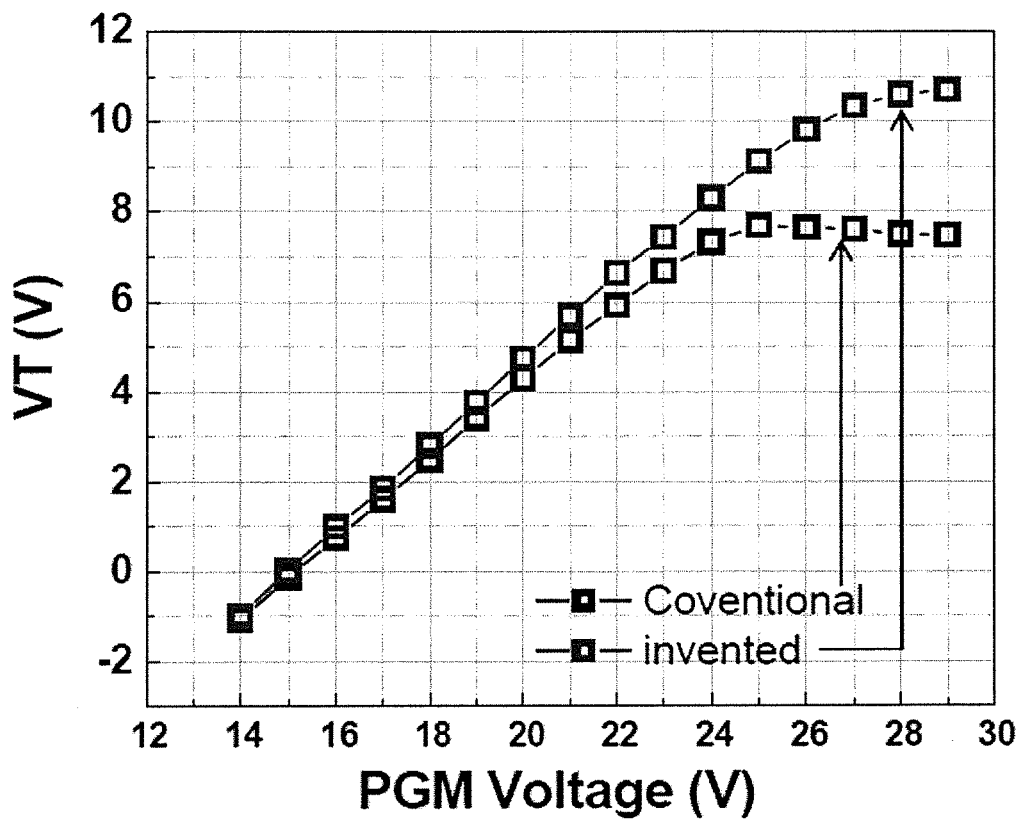

FIG. 4(a) provides a comparison of the program operation of conventional semiconductor devices and the program operation of semiconductor devices prepared according to embodiments of the present invention. As shown in FIG. 4(a), semiconductor devices of the present invention may prolong the program saturation. The prolonged program saturation can be seen in the higher voltages of the device made according to embodiments of the present invention in FIG. 4(a). Without intending to be bound by theory, by incorporating at least one n-type dopant area adjacent to a p-type dopant area within the first conductive layer such that a p-n junction is formed, the charge leakage across the second dielectric layer may be reduced and the program saturation may be prolonged. As used herein, "program saturation" refers to the charge saturation of the conductive layer. The conductive layer may be saturated when the voltage on the substrate side and voltage on the dielectric side of the conductive layer are equal. By prolonging the program saturation, the program window increases. As shown in FIG. 4(a), in this embodiment, the program window is improved by more than 3 V over that of a conventional semiconductor device. In conventional semiconductor devices, the program window may be limited by the thickness of the interpoly dielectric layer. In certain embodiments of the present invention, the program window may not be so limited and can be greatly improved with the incorporation of at least one n-type dopant area adjacent to a p-type dopant area within the conductive layer such that a p-n junction is formed.

Figure 4B:
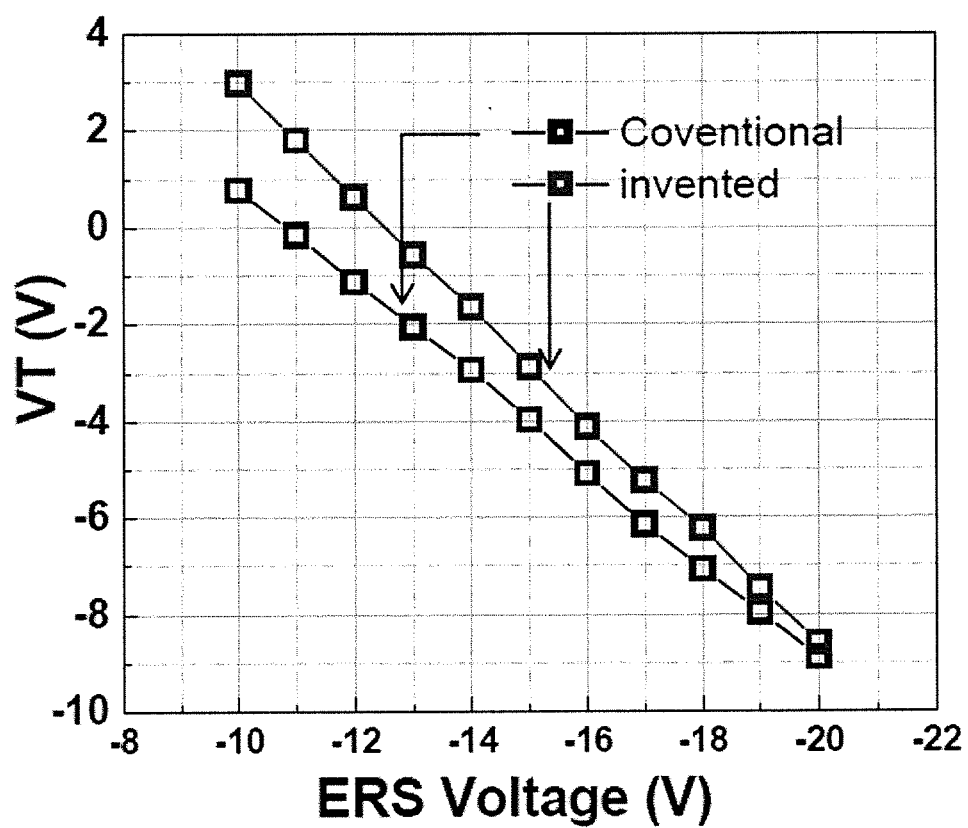

FIG. 4(b) provides a comparison of the erase operation of conventional semiconductor devices and the erase operation of semiconductor devices prepared according to embodiments of the present invention. As shown in FIG. 4(a), semiconductor devices of the present invention may have a larger erase window as compared to conventional semiconductor devices. Without intending to be bound by theory, by incorporating at least one n-type dopant area adjacent to a p-type dopant area within the conductive layer such that a p-n junction is formed, the erase window may be improved.

Figure 5:
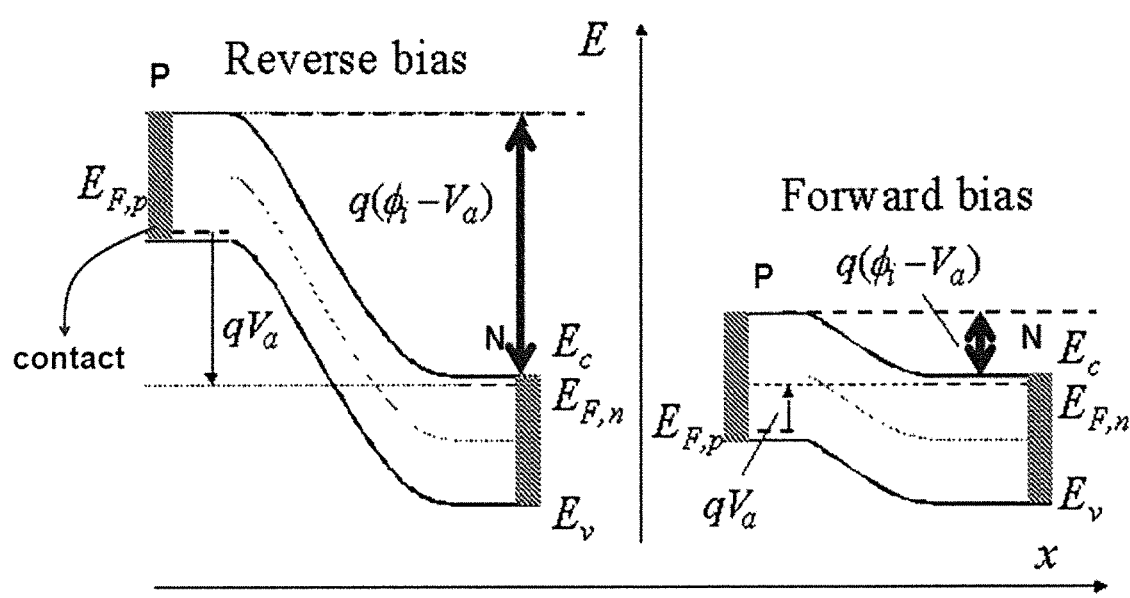
FIG. 5 illustrates the reverse and forward bias of semiconductor devices prepared in accordance with embodiments of the present invention.

FIG. 5 illustrates the reverse and forward bias of semiconductor devices prepared in accordance with embodiments of the present invention. The forward and reverse bias illustrate the application of a voltage across a p-n junction. As shown in FIG. 5, the barrier is higher in the reverse bias direction as compared to the forward bias direction. In certain embodiments of the present invention, the n-type dopant area and the p-type dopant area are in physical contact. In such embodiments, it may not be possible to modulate the potential barrier by external bias. In some embodiments, it may be possible to modulate the potential barrier by modifying the dopant concentration. For instance, in certain embodiments, it may be possible to modulate the potential barrier by using a higher dopant concentration for the n-type dopant area and/or the p-type dopant area.

Figure 6A:
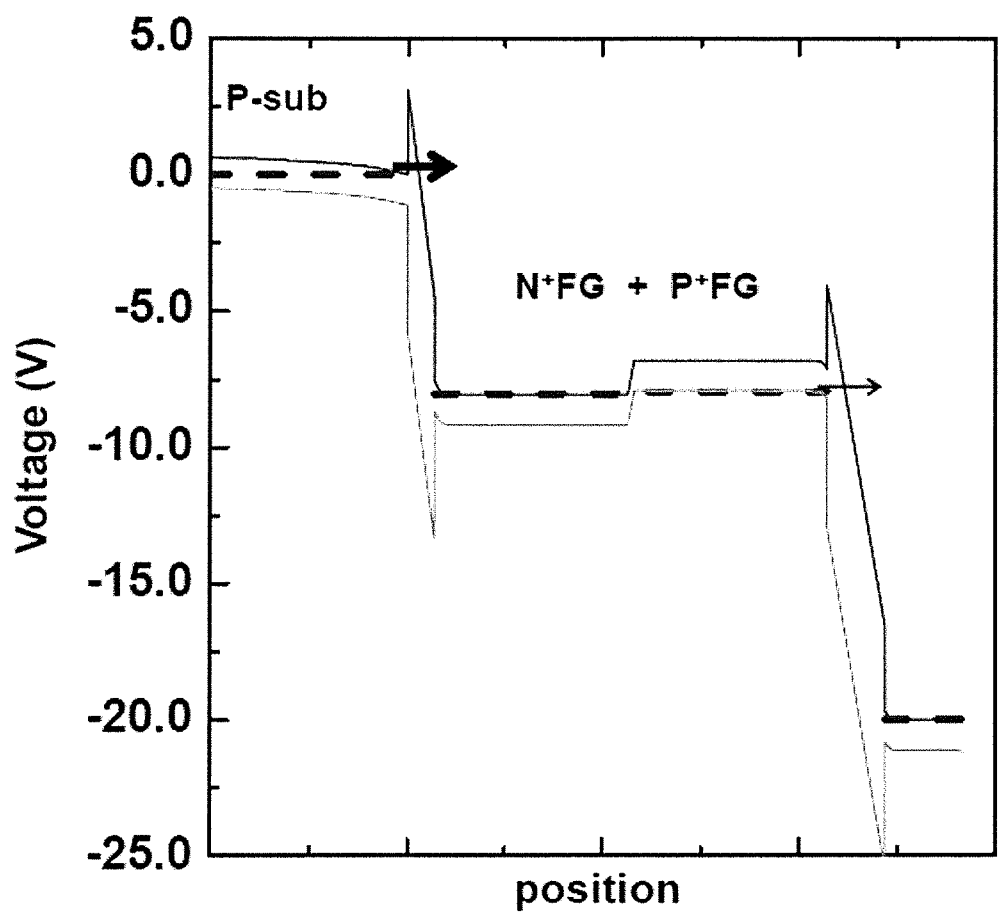
FIG. 6(a) illustrates the program speed in a semiconductor device comprising a conductive layer with n-type dopants and p-type dopants in accordance with embodiments of the present invention.

FIG. 6(a) illustrates the program speed in a semiconductor device comprising a conductive layer with n-type dopants and p-type dopants in accordance with embodiments of the present invention. FIG. 6(a) illustrates current traveling through the substrate ("P-sub") to the n-type dopant area and the p-type dopant area ("N*FG+P*FG"). In the embodiment of FIG. 6(a), the second dielectric layer is located right of the first conductive layer comprising the n-type dopant area and the p-type dopant area. As shown in FIG. 6(a), in this embodiment, the p-type dopant area is at a higher potential than that of the n-type dopant area. In this embodiment, the position of the n-type dopant area adjacent to the p-type dopant area creates a potential barrier that reduces the charge leakage across the second dielectric layer.

Figure 6B:
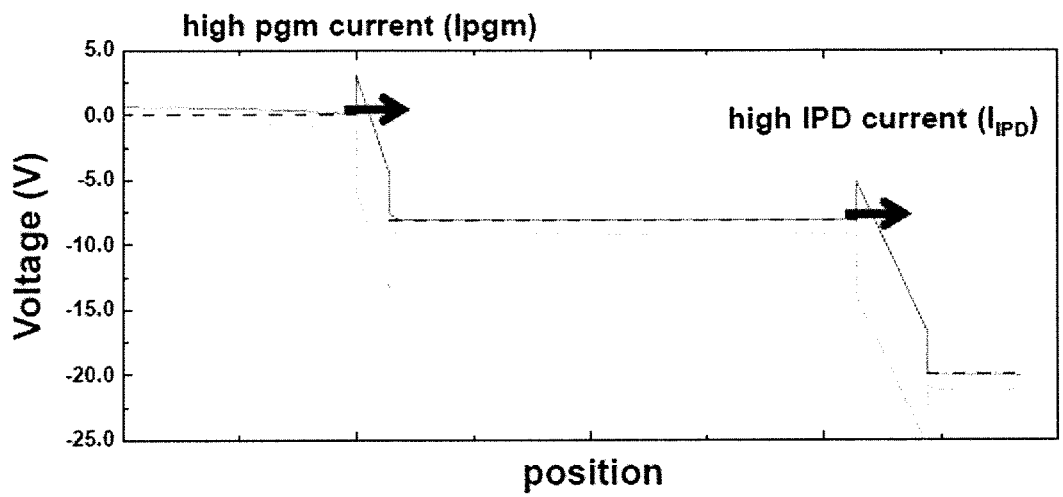
FIG. 6(b) illustrates the program speed in a semiconductor device comprising n-type dopants in a first conductive layer in accordance with conventional semiconductor devices.

FIG. 6(b) illustrates the program speed in a semiconductor device comprising n-type dopants in a first conductive layer in accordance with conventional semiconductor devices. As shown in FIG. 6(b), in conventional semiconductor devices where the conductive layer, such as the floating gate, is doped only with n-type dopants, the program speed is relatively high.

Figure 6C:
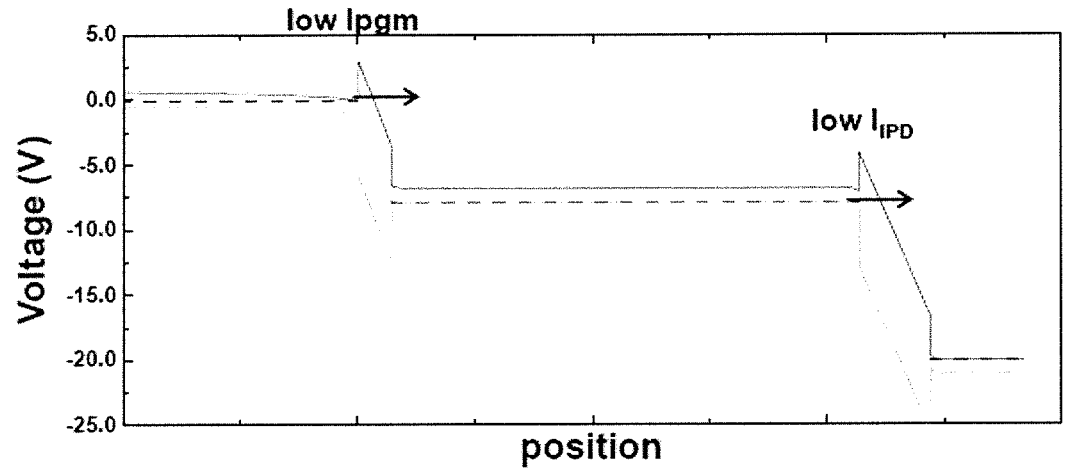
FIG. 6(c) illustrates the program speed in a semiconductor device comprising p-type dopants in a first conductive layer in accordance with conventional semiconductor devices.

FIG. 6(c) illustrates the program speed in a semiconductor device comprising p-type dopants in a first conductive layer in accordance with conventional semiconductor devices. As shown in FIG. 6(b), in conventional semiconductor devices where the conductive layer, such as the floating gate, is doped only with p-type dopants, the program speed is relatively low. In the embodiment illustrated in FIG. 6(a), the advantages of the high program speed in conventional semiconductor devices where the conductive layer, such as the floating gate, is doped with n-type dopants is combined with the advantages of the low program speed in conventional semiconductor devices where the conductive layer, such as the floating gate, is doped with p-type dopants.

Figure 7:
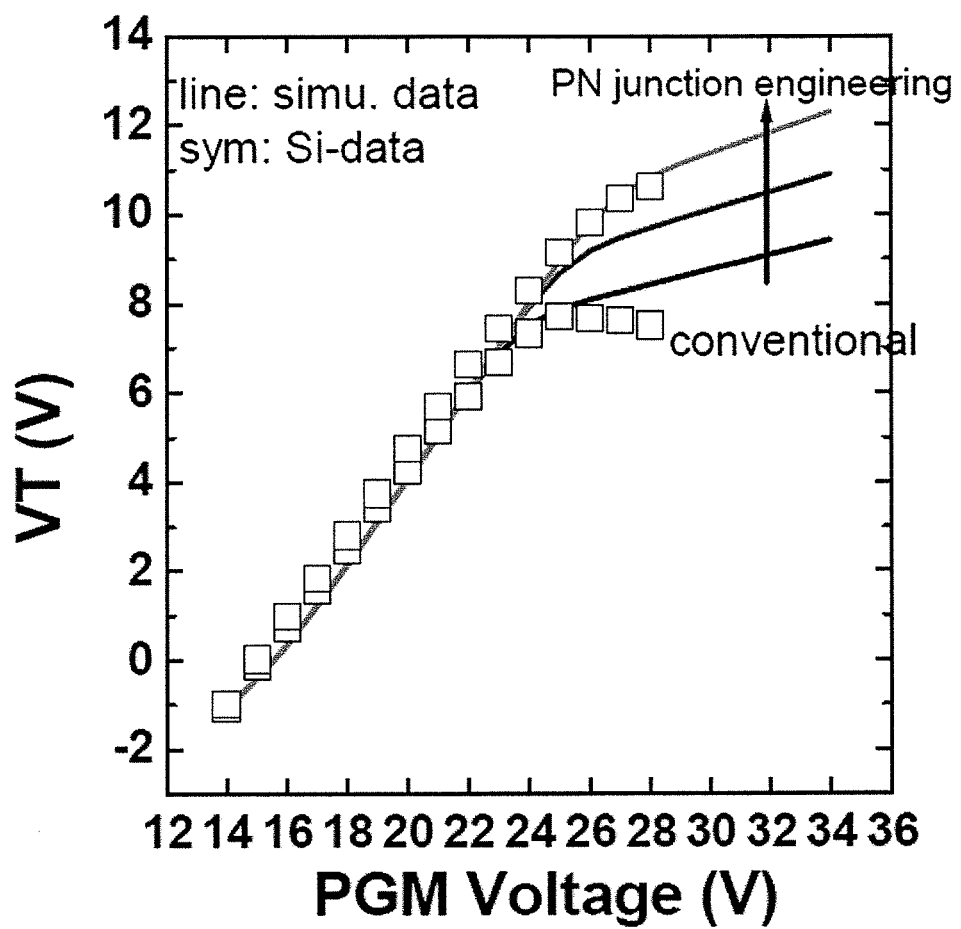
FIG. 7 illustrates the improved program saturation of semiconductor devices prepared according to embodiments of the present invention in comparison to the program saturation of conventional semiconductor devices.

FIG. 7 illustrates the improved program saturation of semiconductor devices prepared according to embodiments of the present invention in comparison to the program saturation of conventional semiconductor devices. The lines in FIG. 7 represent data obtained from simulations of a semiconductor device prepared in accordance with embodiments of the present invention. The symbols in FIG. 7 represent data obtained from operating semiconductor devices in accordance with embodiments of the present invention. As shown in FIG. 7, semiconductor devices of the present invention may prolong the program saturation, increasing the program window. Without intending to be bound by theory, by incorporating at least one n-type dopant area adjacent to a p-type dopant area within the conductive layer such that a p-n junction is created, the charge leakage across the second dielectric layer may be reduced and the program saturation may be prolonged.

Figure 8:
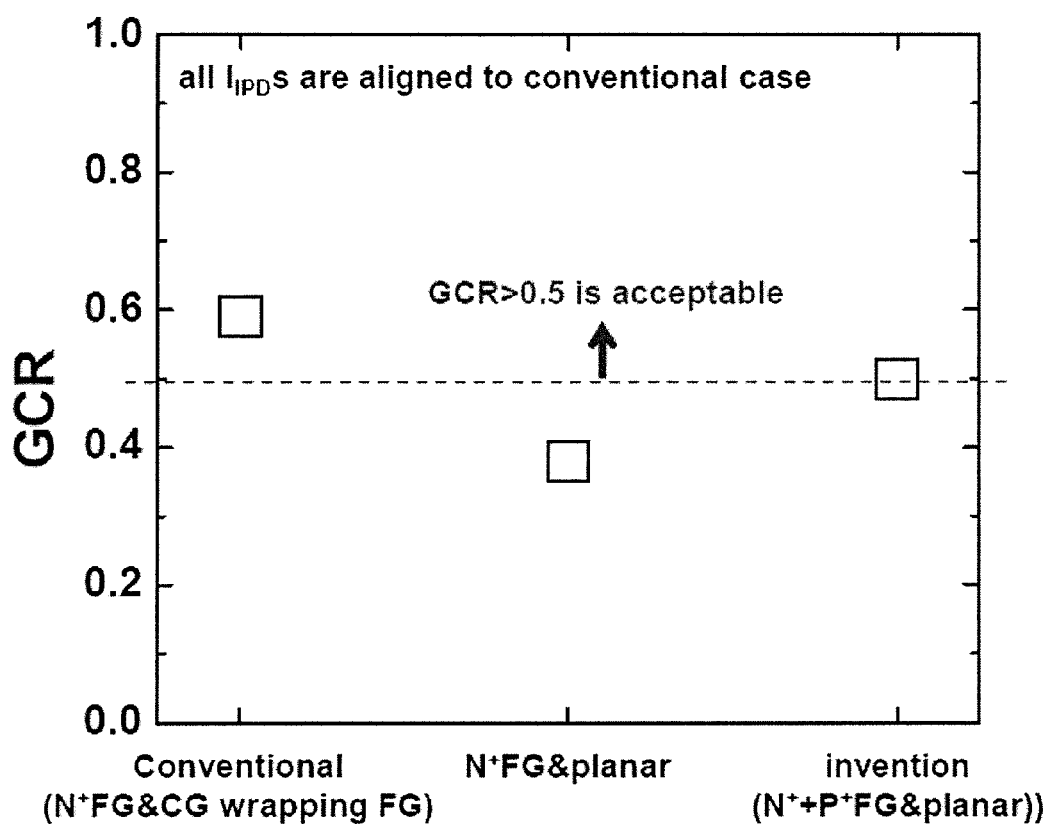
FIG. 8 illustrates the improved gate coupling ratio of semiconductor devices in accordance with embodiments of the present invention as compared to conventional semiconductor devices.

FIG. 8 illustrates the improved gate coupling ratio of semiconductor devices in accordance with embodiments of the present invention as compared to conventional semiconductor devices. FIG. 8 compares the gate coupling ratio of 1) a conventional semiconductor device comprising a floating gate that comprises only n-type dopants and is wrapped by the control gate and the interpoly dielectric layer; 2) a planar interpoly dielectric layer with a floating gate comprising only n-type dopants; and 3) a planar interpoly dielectric layer with a floating gate comprising both an n-type dopant area and a p-type dopant area which form a p-n junction in the floating gate. As shown in FIG. 8, the conventional semiconductor device with a wrapped floating gate has a gate coupling ratio of about 0.6. When the interpoly dielectric layer is made planar and does not wrap the floating gate, the gate coupling ratio decreases significantly to 0.4 and is no longer considered an acceptable gate coupling ratio. However, when an n-type dopant area and p-type dopant area are incorporated in the floating gate to form a p-n junction, the interpoly dielectric layer can be made planar while still achieving an acceptable gate coupling ratio (e.g., about 0.5). The incorporation of a p-n junction in the floating gate may allow the interpoly dielectric layer to be planar. The half-pitch can thereby be reduced and the device made smaller, while still achieving an acceptable gate coupling ratio.

An aspect of the invention provides a semiconductor fabricated using the processes or methods for fabricating a semiconductor as disclosed herein. In certain other embodiments of the invention, a semiconductor device may be fabricated using any combination of the method steps as described herein. Further, any manufacturing process known to those having ordinary skill in the art having the benefit of this disclosure may be used to manufacture the semiconductor devices in accordance with embodiments of the present invention.

Figure 9:
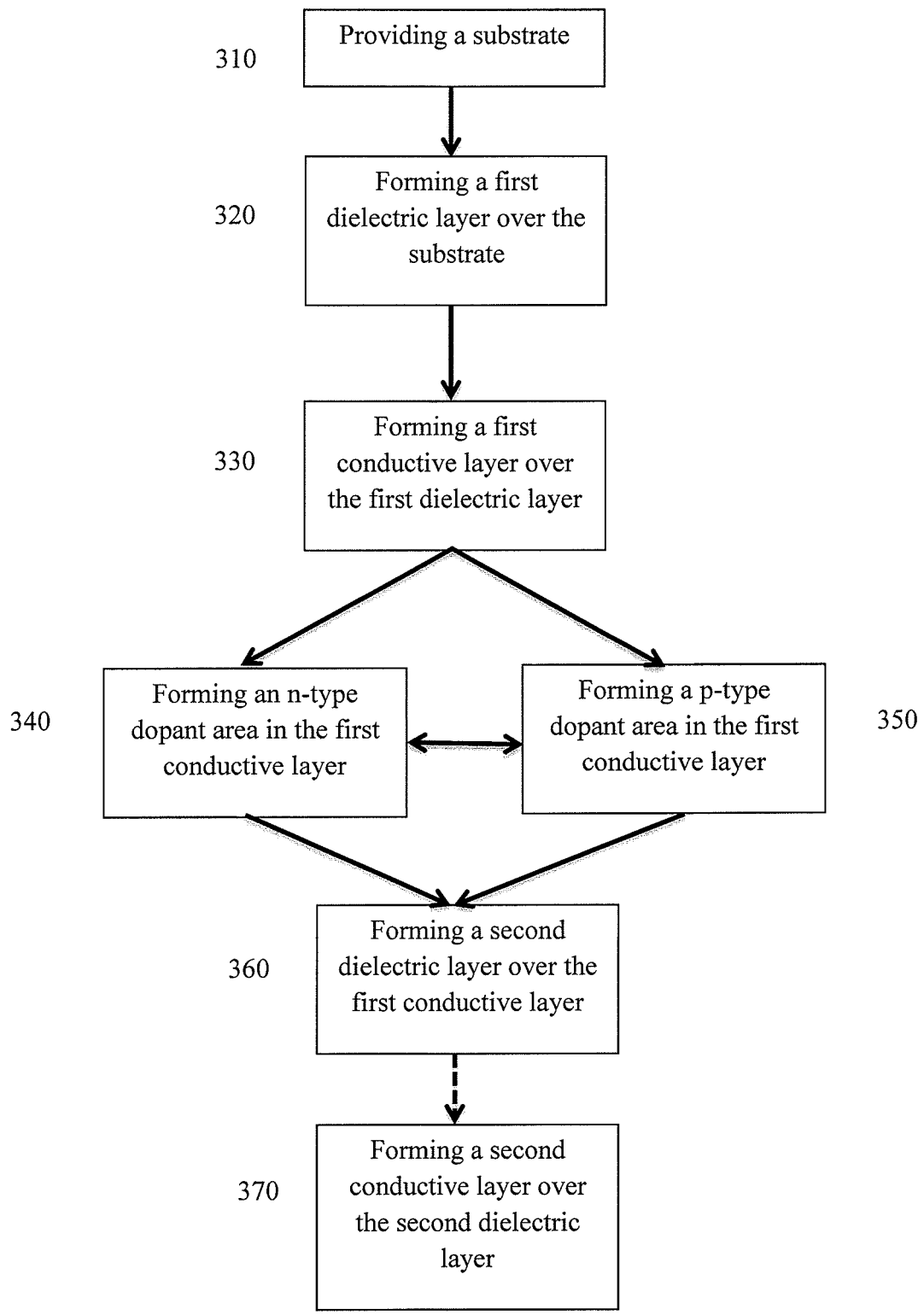
FIG. 9 provides a flow chart of a method of forming a semiconductor device in accordance with embodiments of the present invention.

FIG. 9 provides a flow chart of a method of forming a gate structure for a semiconductor device in accordance with embodiments of the present invention. The method of FIG. 9 includes providing a substrate 310, forming a first dielectric layer over the substrate 320, and forming a first conductive layer over the first dielectric layer 330. The method of FIG. 9 additionally includes forming an n-type dopant area in the first conductive layer 340 and forming a p-type dopant area in the first conductive layer 350. As illustrated in FIG. 9, methods according to this embodiment may include the step of forming an n-type dopant area in the first conductive layer 340 prior to forming a p-type dopant area in the first conductive layer 350 and/or may include the step of forming a p-type dopant area in the first conductive layer 350 prior to forming an n-type dopant area in the first conductive layer 340. In certain embodiments of the present invention, a plurality of n-type dopant areas is formed in the first conductive layer and a plurality of p-type dopant areas is formed in the first conductive layer. These doped areas may be formed in any suitable order so long as at least one potential barrier is formed in the first conductive layer. The method of FIG. 9 may further include the step of forming a second dielectric layer over the first conductive layer 360. In certain embodiments of the present invention, such as that illustrated in FIG. 9, the method of forming a gate structure may further include forming a second conductive layer over the interpoly dielectric layer.

Any of the processes, methods, or techniques as described herein may be used to accomplish any of these steps of the inventive method. Certain of the steps generally described above in the method may themselves comprise other substeps that have not necessarily been identified. Such additional steps are understood by a person of ordinary skill in the art having the benefit of this disclosure.

The present invention may be used for the fabrication of any memory device. For instance, the method of the present invention may be applied to the fabrication of any non-volatile memory device, such as flash memory devices. In certain embodiments, the method of the present invention may be used for the fabrication of NOR or NAND devices.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A gate structure comprising:
    a substrate;
    a first dielectric layer disposed along the substrate;
    a first conductive layer disposed along the dielectric layer;
    a second dielectric layer, and
    a third dielectric layer,
    wherein the second dielectric layer and the third dielectric layer are disposed along a sidewall of the first conductive layer and the second dielectric layer is disposed along and over the third dielectric layer, and
    wherein the first conductive layer comprises p-type dopants and n-type dopants and wherein the p-type dopants form a p-type dopant area and the n-type dopants form an n-type dopant area.

2. The gate structure of claim 1, wherein the p-type dopant area is layered over the n-type dopant area.

3. The gate structure of claim 1, wherein the p-type dopant area is in physical contact with the n-type dopant area.

4. The gate structure of claim 1, wherein a ratio of a thickness of the p-type dopant area to a thickness of the n-type dopant area is from 1:3 to 3:1.

5. The gate structure of claim 1, wherein the second dielectric layer comprises an oxide-nitride-oxide layer.

6. The gate structure of claim 1, wherein the first conductive layer comprises polysilicon.

7. The gate structure of claim 1, additionally comprising a second conductive layer disposed along the second dielectric layer.

8. A method for manufacturing a gate structure comprising
   providing a substrate,
   forming a first dielectric layer over the substrate,
   forming a first conductive layer over the first dielectric layer,
   forming an n-type dopant area in the first conductive layer,
   forming a p-type dopant area in the first conductive layer,
   forming a second dielectric layer along a sidewall of the first conductive layer, and
   forming a third dielectric layer along the sidewall of the first conductive layer,
   wherein the p-type dopant area is layered over the n-type dopant area, and
   wherein the second dielectric layer is disposed along and over the third dielectric layer.

9. The method of claim 8, wherein the step of forming an n-type dopant area in the first conductive area is performed prior to the step of forming a p-type dopant area in the first conductive layer.

10. The method of claim 8, wherein a ratio of a thickness of the p-type dopant area to a thickness of the n-type dopant area is from 1:3 to 3:1.

11. The method of claim 8, wherein the n-type dopant area and the p-type dopant area are in physical contact in the conductive layer.

12. The method of claim 8, wherein the n-type dopant area is formed by ion implantation, in-situ generation, or combinations thereof.

13. The method of claim 8, wherein the p-type dopant area is formed by ion implantation, in-situ generation, or combinations thereof.

14. The method of claim 8, wherein the second dielectric layer comprises an oxide-nitride-oxide layer.

15. The method of claim 8, wherein the first conductive layer comprises polysilicon.

16. The method of claim 8, further comprising forming a second conductive layer over the second dielectric layer.

\* \* \* \* \*